United States Patent
Taya et al.

(10) Patent No.: US 6,777,772 B1
(45) Date of Patent: Aug. 17, 2004

(54) SEMICONDUCTOR DEVICE HAVING IMPROVED TRENCH STRUCTURE

(75) Inventors: Masatoshi Taya, Tokyo (JP); Takio Ohno, Tokyo (JP); Naofumi Murata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/189,870

(22) Filed: Nov. 12, 1998

(30) Foreign Application Priority Data

May 22, 1998 (JP) .......................................... 10-140984

(51) Int. Cl.$^7$ .............................................. H01L 29/00
(52) U.S. Cl. ...................... 257/506; 257/301; 257/302; 257/501; 257/510; 257/797; 438/207; 438/218; 438/219; 438/294; 438/427
(58) Field of Search ................................ 257/301, 302, 257/506, 510, 797, 501; 438/207, 218, 219, 294, 427

(56) References Cited

U.S. PATENT DOCUMENTS

| | | | |
|---|---|---|---|
| 4,502,913 A | * 3/1985 | Lechaton et al. | ........... 156/643 |
| 4,962,061 A | 10/1990 | Takata | |
| 5,094,973 A | * 3/1992 | Pang | ............................. 437/67 |
| 5,449,630 A | * 9/1995 | Lur et al. | ....................... 437/47 |
| 5,662,768 A | * 9/1997 | Rostoker | ...................... 257/301 |
| 6,137,152 A | * 10/2000 | Wu | .............................. 257/510 |
| 6,143,620 A | * 11/2000 | Sharan et al. | ............... 438/398 |
| 6,147,857 A | * 11/2000 | Worley et al. | ............ 361/301.2 |

FOREIGN PATENT DOCUMENTS

| | | | | |
|---|---|---|---|---|
| JP | 05226465 | * | 3/1993 | ................. 438/427 |
| JP | 5-152433 | | 6/1993 | |

* cited by examiner

*Primary Examiner*—Allan R. Wilson
*Assistant Examiner*—Edgardo Ortiz
(74) *Attorney, Agent, or Firm*—McDermott Will & Emery LLP

(57) ABSTRACT

Trenches for defining chip areas are formed on the surface of a semiconductor substrate so that outlines of side walls of each of the trenches have recesses or protrusions. Then, a sputtering film is so formed as to be continuous in an area bridging the surface of each of the chip areas and the inside surface of each of the trenches, and the semiconductor substrate is diced along lines outside the trenches.

8 Claims, 4 Drawing Sheets

FIG.5(a) *PRIOR ART*
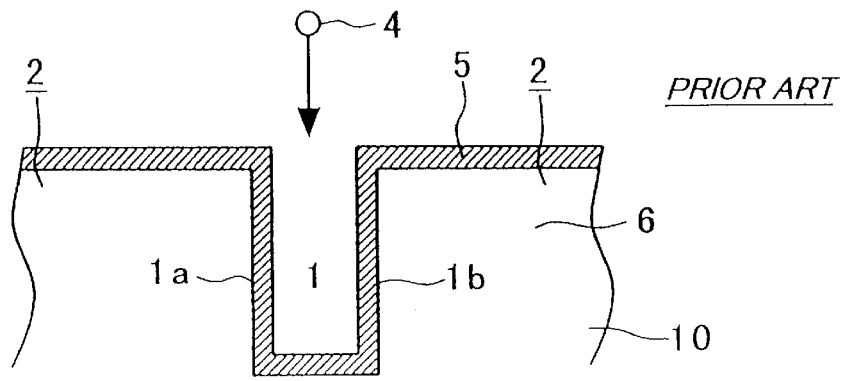
FIG.5(b) *PRIOR ART*
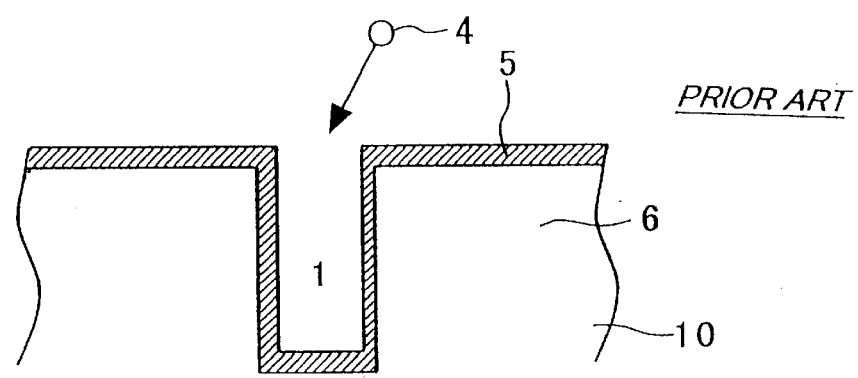
FIG.5(c) *PRIOR ART*
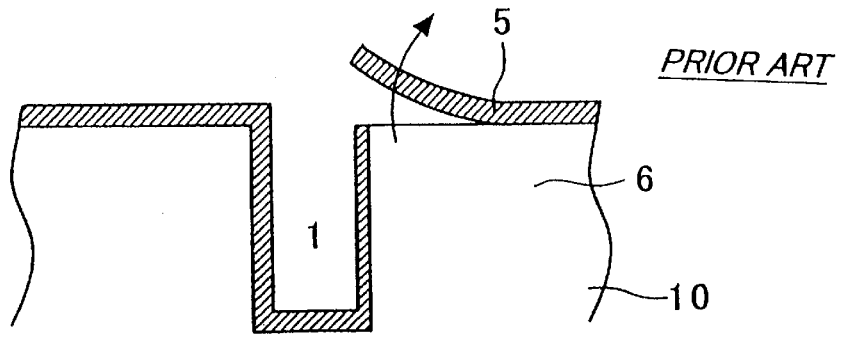

FIG.6(a)                                      PRIOR ART
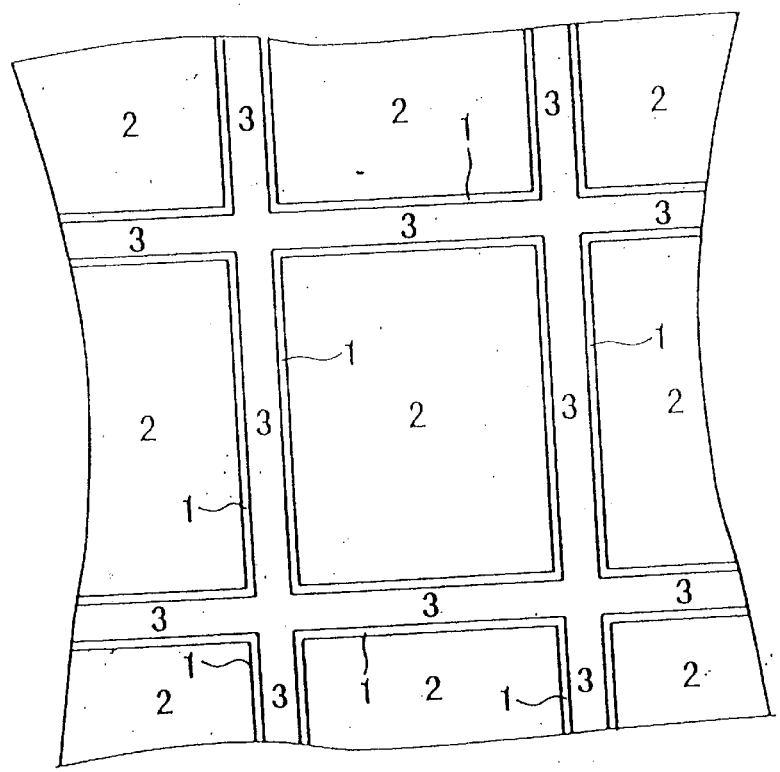
FIG.6(b)
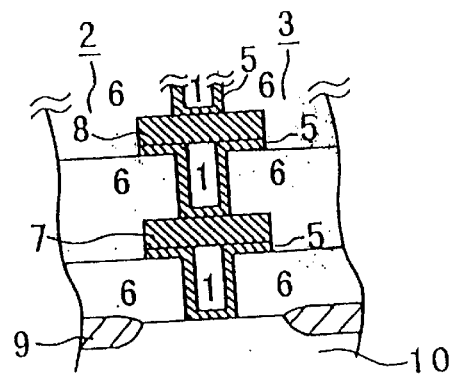
PRIOR ART

SEMICONDUCTOR DEVICE HAVING IMPROVED TRENCH STRUCTURE

BACKGROUND OF THE INVENTION

1. Field of the Invention

The present invention relates to a semiconductor device having an improved shape of trenches formed in chip areas of a semiconductor wafer. Further, the present invention relates to a semiconductor device having an improved shape of trenches that define the peripheries of chip areas of a semiconductor wafer, as well as to manufacturing methods of those semiconductor devices.

2. Background Art

FIGS. 5(a) through 5(c) are sectional views showing the main parts of a semiconductor wafer in a conventional manufacturing process. Specifically, FIG. 5(a) is a sectional view of a trench formed in a central portion of the wafer. FIG. 5(b) is a sectional view of a trench formed at a peripheral portion of the wafer. FIG. 5(c) is a sectional view schematically showing how a sputtering film peels off in a peripheral portion of the wafer.

In FIGS. 5(a) through 5(c), reference numeral 1 denotes a trench formed in a semiconductor wafer 10; 4, a sputtering particle for formation of a sputtering film; 5, a sputtering film that is so formed as to be continuous in an area bridging the surfaces of chip areas 2 and the inside surface of the trench 1; and 6, an interlayer insulating film.

As shown in FIG. 5(a), the sputtering film 5 is formed uniformly on a pattern of the trenches 1 in the central portion of the wafer 10. On the other hand, as shown in FIG. 5(b), the sputtering particles 5 are incident on the wafer 10 obliquely in its peripheral portion, so that the resulting sputtering films formed on side walls 1a and 1b have different thickness. Since a thinner portion of the sputtering film 5 is less resistant to stress or the like, film peeling is prone to occur as shown in FIG. 5(c). That is, a coverage failure of the sputtering film 5 and a resulting film peeling are prone to occur.

FIGS. 6(a) and 6(b) show a plural chip areas on a semiconductor wafer and trenches formed at the peripheries of each chip area. Specifically, FIG. 6(a) is a plan view of a part of a semiconductor wafer and FIG. 6(b) is a sectional view of a trench.

As shown in FIG. 6(a), the peripheries of chip areas 2 are defined by trenches 1. Reference numeral 3 denotes dicing lines. The surface of a semiconductor wafer 10 is sectioned by the dicing lines 3 extending in the vertical and horizontal directions, and each section becomes a chip area 2. Trenches 1 are formed at the boundaries between the chip areas 2 and the dicing lines 3.

FIG. 6(b) shows a sectional shape of one of the trenches 1. In this example, interlayer insulating films 6 are formed in three layers on the semiconductor wafer 10. The trench 1 is formed through the interlayer insulating films 6 and sputtering films 5 are formed thereon. Reference numerals 7 and 8 denote first and second metal layers, respectively, and numeral 9 denotes a field insulating film.

After semiconductor circuits are formed in the respective chip areas 2, the semiconductor wafer 10 is diced along the dicing lines 3 and is thereby divided. The pattern of the trenches 1 that surround the chip areas 2 is provided to prevent a crack from reaching the inside of a chip area 2 during dicing. Therefore, the trenches 1 are formed for each interlayer insulating film 6 as shown in FIG. 6(b).

As described above, in conventional semiconductor wafers, the trenches 1 that surround the chip areas 2 are formed straightly, and their confronting side walls extend also straightly when viewed in a plan view. With a pattern of such trenches extending straightly, it is considered that the peeling of the sputtering film 5 as described in connection with FIG. 5(c) is very prone to occur.

SUMMARY OF THE INVENTION

The present invention has been made to solve the above problems in the conventional art, and an object of the invention is therefore to provide a semiconductor device and a manufacturing method thereof which can prevent a sputtering film from peeling off due to a coverage failure.

The present invention provides a semiconductor device comprising at least a chip area formed on a major surface of a semiconductor wafer. A trench is formed in the chip area so that outlines of side walls of the trench have recesses or protrusions. Further, a sputtering film is formed so as to be continuous in an area bridging a surface of the chip area and an inside surface of the trench.

According to another aspect of the present invention, there is provided a semiconductor device comprising a plurality of chip areas formed on a major surface of a semiconductor wafer. A plurality of trenches are formed at a periphery of each chip area so that outlines of side walls of the trench have recesses or protrusions. Further, a sputtering film is formed so as to be continuous in an area bridging a surface of the chip area and an inside surface of the trench.

In another aspect, in each of the above semiconductor devices, the recesses or protrusions of one of the confronting side walls of the trench may be facing protrusions or recesses of the other side wall.

The protrusions of one of the confronting side walls may extend into the recesses of the other side wall.

The plan-view shape of the recesses or protrusions may be a part of one of a rectangle, a triangle, and a circle.

According to another aspect of the present invention, in a manufacturing method of a semiconductor device, trenches are formed to define chip areas on a surface of a semiconductor substrate, and the outlines of the side walls of each of the trenches are formed to have recesses or protrusions. A sputtering film is formed so as to be continuous in an area bridging a surface of each of the chip areas and an inside surface of each of the trenches. Thereafter, the semiconductor substrate is diced along lines outside the trenches.

Other and further objects, features and advantages of the invention will appear more fully from the following description.

BRIEF DESCRIPTION OF THE DRAWINGS

FIGS. 5(a) through 5(c) are sectional views of a conventional semiconductor wafer in which a sputtering film is formed on a trench pattern; and FIGS. 6(a) and 6(b) show chip areas of a semiconductor wafer and a trench pattern that extends along dicing lines.

DETAILED DESCRIPTION OF THE PREFERRED EMBODIMENTS

Figure 1A:
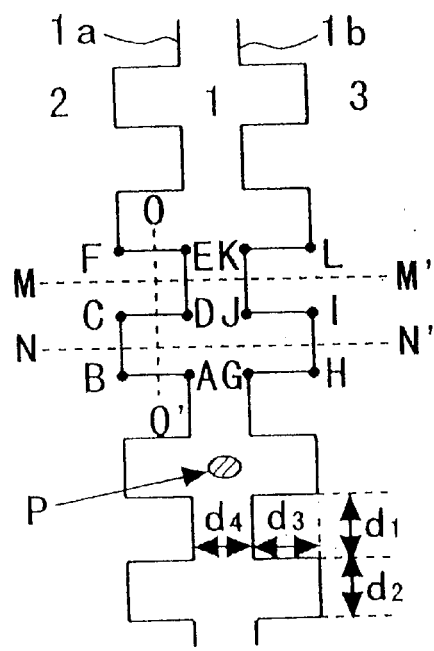
FIGS. 1(a) through 1(d) show an example of the shape of a trench pattern formed inside or at the periphery of a chip area according to a first embodiment of the present invention.

The embodiments of the present invention will be hereinafter described with reference to the accompanying drawings. In the drawings, the same or corresponding portions are given the same reference numerals and descriptions therefor may be simplified or omitted.

First Embodiment

Figure 1B:
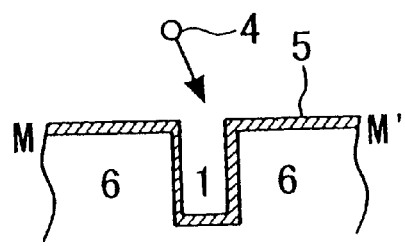
Figure 1C:
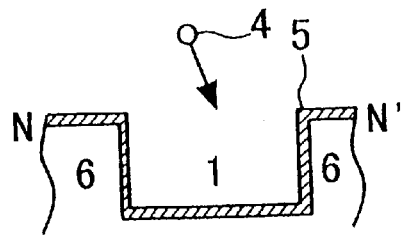
Figure 1D:
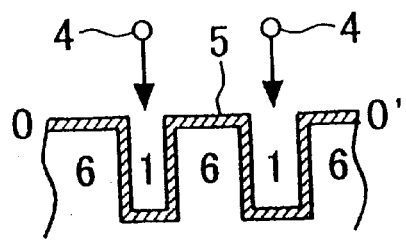

FIGS. 1(a) through 1(d) show the shape of a trench pattern according to a first embodiment of the present invention that is formed inside or at the periphery of a chip area. Specifically, FIG. 1(a) is an enlarged plan view of a portion of a trench pattern, and FIGS. 1(b) through 1(d) are sectional views of respective portions of a trench showing coverage states of a sputtering film. FIGS. 1(b) through 1(d) are taken along lines M—M, N—N, and O—O in FIG. 1(a), respectively.

As shown in FIGS. 1(a) through 1(d), this embodiment has a feature that the trench 1 is so formed that the outlines of confronting side walls 1a and 1b have recesses or protrusions, in other words, plan-view shapes (when the trench 1 is viewed from above) of the side walls 1a and 1b have recesses or protrusions.

Further, in this embodiment, the recesses of the side wall 1a of the trench 1 are opposed to those of the side wall 1b. In other words, the former are symmetrical with the latter with respect to the center line of the trench 1.

Such a trench 1 may be formed either in a small portion of a chip area or at predetermined positions over a wide range of a chip portion, depending on the purpose. A typical example is such that as in the case of FIG. 6(a) the trench 1 is formed in a rectangular-ring-like manner at the periphery that defines each chip area on a semiconductor wafer 10.

Advantages of the above trench pattern will be described below with reference to FIGS. 1(a) through 1(d). An example is assumed that the trench pattern of FIG. 1(a) is located at a wafer peripheral portion and a large part of sputtering particles 4 are incident obliquely in the direction indicated in FIG. 1(b). In this case, it is also assumed that the wafer center is located on the left side of the paper surface.

As seen from FIG. 1(b) that is taken along line M—M in FIG. 1(a), or from FIG. 1(c) that is taken along line N—N in FIG. 1(a), side wall portions of segments DE and BC of the trench side wall 1a (see FIG. 1(a)) are shadow portions of sputtering. Therefore, a sputtering film 5 is hard to be formed on those side wall portions and hence the coverage becomes worse there.

On the other hand, as shown in FIG. 1(d) that is a sectional view taken along line O—O in FIG. 1(a), the sputtering film 5 is formed normally on side wall portions of segments AB, CD, and EF of the trench side wall 1a, because a sufficient number of sputtering particles 4 are incident on those portions. Therefore, the side wall portion of segment BC that is low in coverage is reinforced by the side wall portions of segments AB and CD that are high in coverage. Similarly, the side wall portion of segment DE that is low in coverage is reinforced by the side wall portions of segments CD and EF that are high in coverage. In this manner, the sputtering film 5 can be made less prone to peel off.

The same thing applies to the case where the wafer center is located on the right side on the paper surface. That is, a side wall portion of segment HI can be reinforced by side wall portions of segments GH and IJ and a side wall portion of segment JK can be reinforced by side line portions of segments IJ and KL. It is for this purpose to provide protrusions in the outline shapes of the side walls 1a and 1b on both sides. Now, let d1, d2, d3 and d4 represent the width of each protrusion, the width of each recess, the depth of each protrusion, and the minimum interval between the confronting side walls 1a and 1b, respectively as shown in FIG. 1(a). As for the shapes of the protrusions and recesses of the trench side walls 1a and 1b, the values of d1 through d4 and their ratios are not limited to those shown in FIG. 1(a) and may be set in various manners. For example, a setting may be made such that d1=d2=d3=d4=0.4 $\mu$m.

An example of the material of the sputtering film 5 is TiN/Ti=1,000/200 Å.

Figure 2A:
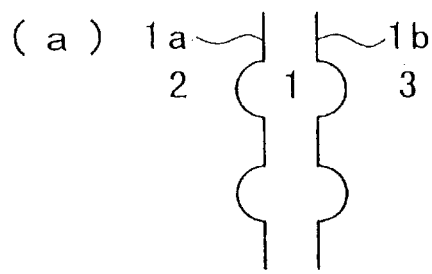
FIGS. 2(a) and 2(b) show other examples of the shape of a trench pattern formed inside or at the periphery of a chip area according to the first embodiment of the present invention.
Figure 2B:
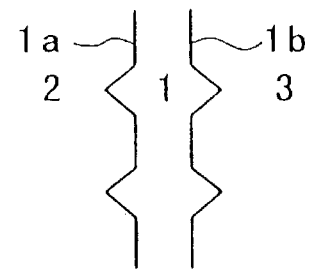

FIGS. 2(a) and 2(b) are plan views showing other pattern shapes of trenches that define chip areas according to this embodiment.

In FIG. 2(a), semicircular or semi-elliptical recesses are formed in both side walls 1a and 1b of a generally straight trench 1.

In FIG. 2(b), recesses each consisting of two sides of a triangle are formed in both side walls 1a and 1b of a generally straight trench 1.

As exemplified above, the shape of the recesses formed in the side walls of the trench 1 is not limited to a rectangle, and similar effect can be obtained by circular and triangular recesses. The important point is that the outline of the recesses have a component that is parallel with the incidence direction of sputtering particles. Since a sputtering film is formed in accordance with the shape of those recesses, the effect to prevent film peeling can be obtained.

Next, a general description will be made of a manufacturing method of a semiconductor device to which the above trench for defining a chip area is applied.

First, chip areas are formed on a semiconductor wafer. A desired circuit is formed in each chip area by forming active elements such as transistors and passive elements such as resistors. Then, this circuit is covered with an interlayer insulating film. Then, a photoresist mask having a predetermined pattern is formed to form via-holes for interlayer connections through the interlayer insulating film.

The above steps are for formation of an ordinary semiconductor device. In this embodiment, the photoresist mask is formed into a pattern for forming a trench as shown in FIGS. 1(a) through 1(d) at the periphery of each chip area. That is, the resist mask is so formed as to serve for formation of both via-holes and a trench.

Then, at the same time as via-holes are formed by etching, a trench is formed at the periphery of each chip area by etching. Thereafter, a sputtering film is formed so as to be continuous in an area bridging the surface of each chip area and the inside surface of the trench. Subsequently, a metal wiring is formed by filling in the via-holes and the trench by performing tungsten CVD or the like and then performing etch back.

The above is a general description of the steps for forming one layer of a multilayered structure of the semiconductor device. These steps are repeated in accordance with the number of metal wiring layers.

After formation of necessary layers of the multilayered structure, a passivation film is formed on the entire surface.

Then, the semiconductor wafer is diced along dicing lines to produce a plurality of chips. Each chip is mounted to complete a semiconductor device.

The above manufacturing method of a semiconductor device can be summarized as follows. First, on the surface of a semiconductor substrate, a trench for defining each chip area is so formed that the outlines of the respective side walls of the trench has protrusions or recesses. Then, after execution of necessary steps, a sputtering film is so formed as to be continuous in an area bridging the surface of each chip area and the inside surface of the trench. Then, after execution of necessary steps, the semiconductor substrate is diced along the trenches to produce a plurality of chips.

This embodiment can be applied to a wide variety of semiconductor devices such as a DRAM, an SRAM, and logic devices. No specific limitations exist for the application range of this embodiment.

Second Embodiment

Figure 3:
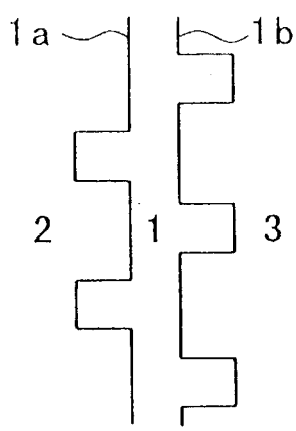
FIG. 3 is a plan view showing a shape of a trench pattern according to a second embodiment of the present invention.

FIG. 3 is a plan view showing a shape of a trench pattern according to a second embodiment of the present invention that is formed inside each chip area or formed at the periphery of each chip area to define the chips.

In this embodiment, recesses and protrusions of one of confronting side walls of a trench are deviated in position from those of the other side wall in such a manner that the recesses of one side wall are opposed to the protrusions of the other.

In other words, the recesses and the protrusions of the confronting side walls are arranged alternately.

This trench pattern provides basically the same advantages as in the first embodiment.

Where the trench pattern is filled in with tungsten or the like by CVD in the first embodiment, it is expected from the principle of CVD that it is hard to fill in the trench pattern at point P (see FIG. 1(a)) because of almost no trench side wall portions close to point P. The second embodiment is advantageous in that the trench pattern can be filled in easily because side wall portions exist close to a point corresponding to point P.

Third Embodiment

Figure 4:
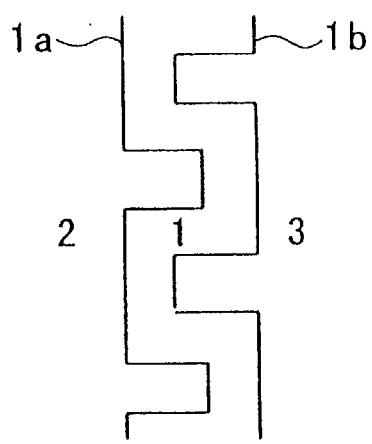
FIG. 4 is a plan view showing a shape of a trench pattern according to a third embodiment of the present invention.

FIG. 4 is a plan view showing a shape of a trench pattern according to a third embodiment of the present invention that is formed inside each chip area or at the periphery of each chip area.

In this embodiment, a trench 1 is snaked. In other words, the trench 1 is so formed that protrusions of one of confronting side walls go into recesses of the other.

This trench pattern provides basically the same advantages as in the first embodiment.

Where the trench pattern is filled in with tungsten or the like by CVD, this embodiment is advantageous in that the trench pattern can be filled in easily because any point in the trench pattern has nearby side wall portions.

The effects and advantages of the present invention may be summarized as follows.

As described above, according to the present invention, a trench is formed in a chip area on the surface of a semiconductor substrate so that the outlines of the trench side walls have protrusions or recesses. This provides an advantage that in manufacture of a semiconductor device a sputtering film formed on the surface of the semiconductor substrate hardly peels off. This in turn makes it possible to increase the yield of the manufacture of a semiconductor device as well as to manufacture a semiconductor device having uniform performance in a stable manner.

Further, according to the present invention, a trench is formed at the periphery of a chip area on the surface of a semiconductor substrate so that the outlines of the trench side walls have protrusions or recesses. This provides an advantage that in manufacture of a semiconductor device a sputtering film formed on the surface of the semiconductor substrate hardly peels off. Another advantage is provided that when a semiconductor wafer is diced into a plurality of chips, a crack is prevented from reaching the inside of a chip and a sputtering film hardly peels off. These advantages in turn make it possible to increase the yield of the manufacture of a semiconductor device as well as to manufacture a semiconductor device having uniform performance in a stable manner.

Obviously many modifications and variations of the present invention are possible in the light of the above teachings. It is therefore to be understood that within the scope of the appended claims the invention may by practiced otherwise than as specifically described.

What is claimed is:

1. A semiconductor device comprising:
    at least one chip area formed on a major surface of a semiconductor wafer;
    at least one trench formed in said chip area, the outlines of side walls of said trench, in plan-view, having either recesses extending toward the chip area or protrusions extending away from the chip area; and
    a sputtering film formed so as to be continuous in an area bridging a surface of said chip area and an inside surface of said trench.

2. The semiconductor device according to claim 1, wherein said each recess or protrusion of one of the confronting side walls of said trench is facing respectively to each protrusion or recess of the other side wall.

3. The semiconductor device according to claim 2, wherein said each protrusion of one of the confronting side walls extends into the corresponding recess of the other side wall.

4. The semiconductor device according to claim 1, wherein a plan-view shape of said recess or protrusion of said trench is formed in a shape of a portion of a rectangle, a triangle, or a circle.

5. A semiconductor device comprising:
    a plurality of chip areas formed on a major surface of a semiconductor wafer;
    a plurality of trenches each formed at a periphery of said chip areas, the outlines of said side walls of said trenches, in plan-view, having recesses extending toward the chip area or protrusions extending away from the chip area; and
    a sputtering film formed so as to be continuous in an area bridging a surface of each chip area and an inside surface of said trench.

6. The semiconductor device according to claim 5, wherein said each recess or protrusion of one of the confronting side walls of said trench is facing respectively to each protrusion or recess of the other of the confronting side walls.

7. The semiconductor device according to claim 6, wherein said each protrusion of one of the confronting side walls extends into the corresponding recess of the other side wall.

8. The semiconductor device according to claim 5, wherein a plan-view shape of said recess or protrusion of said trench is formed in a shape of a portion of a rectangle, a triangle, or a circle.

* * * * *